(12) United States Patent
Kondo et al.

(10) Patent No.: US 12,345,744 B2
(45) Date of Patent: Jul. 1, 2025

(54) DIAGNOSIS SYSTEM AND DIAGNOSIS METHOD FOR OPENING/CLOSING DEVICE

(71) Applicant: MITSUBISHI HEAVY INDUSTRIES, LTD., Tokyo (JP)

(72) Inventors: Kazuumi Kondo, Tokyo (JP); Mitsuaki Hoshi, Yokohama (JP); Fujio Shinoki, Yokohama (JP); Kosaku Murase, Yokohama (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 293 days.

(21) Appl. No.: 17/790,816

(22) PCT Filed: Feb. 10, 2021

(86) PCT No.: PCT/JP2021/004876
§ 371 (c)(1),
(2) Date: Jul. 5, 2022

(87) PCT Pub. No.: WO2021/166752
PCT Pub. Date: Aug. 26, 2021

(65) Prior Publication Data
US 2023/0035170 A1  Feb. 2, 2023

(30) Foreign Application Priority Data

Feb. 19, 2020  (JP) .................................. 2020-026414

(51) Int. Cl.
*G01R 19/165*  (2006.01)
*B60J 5/06*  (2006.01)
(Continued)

(52) U.S. Cl.
CPC .......... *G01R 19/16533* (2013.01); *B60J 5/06* (2013.01); *B61B 1/02* (2013.01); *B66B 13/14* (2013.01);
(Continued)

(58) Field of Classification Search
CPC ............ G01R 19/16533; G01R 15/146; G01R 19/165; G01R 19/16566; G01R 19/16571;
(Continued)

(56) References Cited

U.S. PATENT DOCUMENTS

2008/0230245 A1    9/2008  Matsunaga

FOREIGN PATENT DOCUMENTS

| CN | 1199704 A | * | 11/1998 | ............. B66B 13/14 |
| CN | 105800434 A | * | 7/2016 | ............ B66B 13/143 |

(Continued)

OTHER PUBLICATIONS

Japan Patent Office, "Office Action for Japanese Patent Application 2020-026414," Oct. 10, 2023.

(Continued)

*Primary Examiner* — Benjamin R Schmitt
(74) *Attorney, Agent, or Firm* — HAUPTMAN HAM, LLP

(57) ABSTRACT

A diagnosis system diagnoses the integrity of an opening/closing device capable of opening and closing by driving a motor. A driving current acquisition unit acquires a driving current of the motor. A diagnosis unit defines a current waveform from a temporal change of the driving current acquired by the driving current acquisition unit and diagnoses the integrity of the opening/closing device based on the current waveform.

12 Claims, 8 Drawing Sheets

(51) Int. Cl.
| | |
|---|---|
| *B61B 1/02* | (2006.01) |
| *B66B 13/14* | (2006.01) |
| *E05F 15/643* | (2015.01) |
| *G01M 13/023* | (2019.01) |
| *G01R 15/14* | (2006.01) |
| *H02K 7/10* | (2006.01) |
| *H02K 11/35* | (2016.01) |
| *G01M 13/00* | (2019.01) |
| *G01M 99/00* | (2011.01) |
| *G01R 11/30* | (2006.01) |

(52) U.S. Cl.
CPC .......... *B66B 13/143* (2013.01); *E05F 15/643* (2015.01); *G01M 13/023* (2013.01); *G01R 15/146* (2013.01); *G01R 19/165* (2013.01); *G01R 19/16566* (2013.01); *G01R 19/16571* (2013.01); *G01R 19/16585* (2013.01); *G01R 19/16595* (2013.01); *H02K 7/1004* (2013.01); *H02K 11/35* (2016.01); *E05Y 2201/434* (2013.01); *E05Y 2201/652* (2013.01); *E05Y 2400/10* (2013.01); *E05Y 2400/40* (2013.01); *E05Y 2400/44* (2013.01); *E05Y 2400/458* (2013.01); *E05Y 2400/54* (2013.01); *E05Y 2900/506* (2013.01); *E05Y 2900/51* (2013.01); *G01M 13/00* (2013.01); *G01M 99/008* (2013.01); *G01R 11/30* (2013.01)

(58) Field of Classification Search
CPC ........ G01R 19/16585; G01R 19/16595; G01R 11/30; G01M 13/023; G01M 13/00; G01M 99/008; B66B 13/14; B66B 13/143; B60J 5/06; B61B 1/02
See application file for complete search history.

(56) References Cited

FOREIGN PATENT DOCUMENTS

| | | | | |
|---|---|---|---|---|
| CN | 109116161 A | | 1/2019 | |
| JP | 2003261270 A | | 9/2003 | |
| JP | 3835522 B2 | | 10/2006 | |
| JP | 2007-210474 A | | 8/2007 | |
| JP | 3953491 B2 | | 8/2007 | |
| JP | 2008-120471 A | | 5/2008 | |
| JP | 2008230742 A | | 10/2008 | |
| JP | 2012-116578 A | | 6/2012 | |
| JP | 2013049550 A | * | 3/2013 | ............. B66B 13/14 |
| JP | 2013-237375 A | | 11/2013 | |
| JP | 2017-218151 A | | 12/2017 | |
| JP | 2019099340 A | | 6/2019 | |
| JP | 2019-111899 A | | 7/2019 | |
| JP | 2019-182252 A | | 10/2019 | |
| WO | WO-2005087441 A1 | * | 9/2005 | ........... B25B 23/141 |
| WO | WO-2014199688 A1 | * | 12/2014 | ........... B66B 13/143 |

OTHER PUBLICATIONS

PCT/ISA/210 & PCT/ISA/237, "International Search Report and Written Opinion for PCT International Application No. PCT/JP2021/0004876," Apr. 27, 2021.
PCT/IB/338 & PCT/IB/373"International Preliminary Report on Patentability for PCT International Application No. PCT/JP2021/0004876," Sep. 1, 2022.
Japan Patent Office, "Office Action for Japanese Patent Application 2020-026414," Jun. 13, 2023.
Japan Patent Office, "Reconsideration Report by Examiner Before Appeal for JP Application No. 2020-026414", May 8, 2024, 11pp.
Notice of Reasons for Refusal for Japanese Application No. 2020-026414 mailed on Mar. 11, 2025; 27 pp.

* cited by examiner

DIAGNOSIS SYSTEM AND DIAGNOSIS METHOD FOR OPENING/CLOSING DEVICE

RELATED APPLICATIONS

The present application is National Phase of International Application No. PCT/JP2021/004876 filed Feb. 10, 2021, and claims priority from Japanese Application No. 2020-026414, filed Feb. 19, 2020, the disclosure of which is hereby incorporated by reference herein in its entirety.

TECHNICAL FIELD

The present disclosure relates to a diagnosis system and a diagnosis method for an opening/closing device.

BACKGROUND

In transportation platforms such as buses, railroads, and trams, opening/closing devices such as platform doors may be installed to restrict access to predetermined areas where vehicles enter (for example, Patent Document 1). This type of opening/closing device is being introduced as an element of a new transportation system using new technologies which are different from conventional transportation, such as staff-saving operation and unmanned operation.

CITATION LIST

Patent Literature

Patent Document 1: JP2017-218151A

SUMMARY

Problems to be Solved

Since the opening/closing device opens and closes in response to the traffic of vehicles, the operating rate is high, and the failure rate tends to be relatively high in components of the new transportation system. A malfunction of the opening/closing device may affect not only the opening/closing device itself but also the entire commercial operation of the new transportation system. It is preferable to prevent such a malfunction by performing maintenance such as inspection or replacement of parts at predetermined timings, but the manpower of workers is limited, and conventional maintenance involves business interruption. Therefore, it is difficult to carry out the maintenance frequently.

At least one embodiment of the present disclosure was made in view of the above, and an object thereof is to provide a diagnosis system and a diagnosis method for an opening/closing device whereby it is possible to diagnose the integrity reliably with a reduced effect on the operating state of the opening/closing device.

Solution to the Problems

To solve the above problem, a diagnosis system according to at least one embodiment of the present disclosure for an opening/closing device capable of opening and closing by driving a motor comprises: a driving current acquisition unit configured to acquire a driving current of the motor; and a diagnosis unit configured to diagnose the integrity of the opening/closing device, based on a current waveform defined by a temporal change of the driving current acquired by the driving current acquisition unit.

To solve the above problem, a diagnosis method according to at least one embodiment of the present disclosure for an opening/closing device capable of opening and closing by driving a motor comprises: a step of acquiring a driving current of the motor; and a step of diagnosing the integrity of the opening/closing device, based on a current waveform defined by a temporal change of the driving current.

Advantageous Effects

At least one embodiment of the present disclosure provides a diagnosis system and a diagnosis method for an opening/closing device whereby it is possible to diagnose the integrity reliably with a reduced effect on the operating state of the opening/closing device.

DETAILED DESCRIPTION

Embodiments of the present invention will now be described in detail with reference to the accompanying drawings. It is intended, however, that unless particularly identified, dimensions, materials, shapes, relative positions, and the like of components described in the embodiments shall be interpreted as illustrative only and not intended to limit the scope of the present invention.

For instance, an expression of relative or absolute arrangement such as "in a direction", "along a direction", "parallel", "orthogonal", "centered", "concentric" and "coaxial" shall not be construed as indicating only the arrangement in a strict literal sense, but also includes a state where the arrangement is relatively displaced by a tolerance, or by an angle or a distance whereby it is possible to achieve the same function.

For instance, an expression of an equal state such as "same" "equal" and "uniform" shall not be construed as indicating only the state in which the feature is strictly equal, but also includes a state in which there is a tolerance or a difference that can still achieve the same function.

Further, for instance, an expression of a shape such as a rectangular shape or a cylindrical shape shall not be construed as only the geometrically strict shape, but also includes a shape with unevenness or chamfered corners within the range in which the same effect can be achieved.

On the other hand, an expression such as "comprise", "include", "have", "contain" and "constitute" are not intended to be exclusive of other components.

Figure 1:
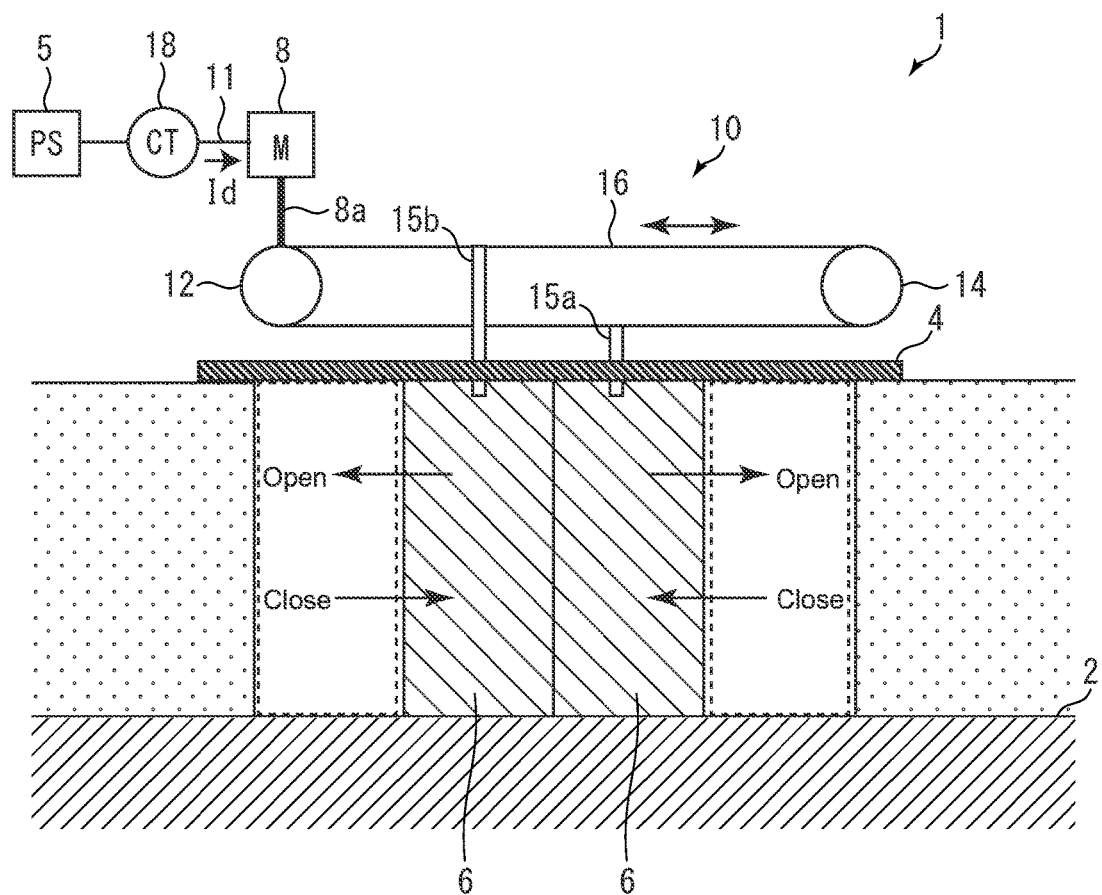
FIG. 1 is a schematic diagram of an example of an opening/closing device.

First, an opening/closing device 1 to be diagnosed by a diagnosis system according to at least one embodiment of the present disclosure will be described. FIG. 1 is a schematic diagram of an example of the opening/closing device 1. FIG. 1 shows the opening/closing device 1 provided on a floor surface 2 from the side.

The opening/closing device 1 includes a pair of doors 6 capable of opening and closing along a rail 4 installed above the floor surface 2 substantially parallel to the floor surface 2, a motor 8 serving as a power source, and a power transmission mechanism 10 for transmitting the power of the motor 8 to the doors 6. The motor 8 is an electric motor driven by electric power supplied from a power supply 5 to output power, and may be a DC motor that can be driven by DC power, or an AC motor that can be driven by AC power.

The power output from the motor 8 is transmitted to the pair of doors 6 via the power transmission mechanism 10. The power transmission mechanism 10 includes a driving pulley 12 connected to an output shaft 8a of the motor 8, a driven pulley 14 arranged to face the driving pulley 12, and a belt member 16 which is an endless drive timing belt mounted around the driving pulley 12 and the driven pulley 14. When the driving pulley 12 is rotated by the power from the motor 8, the belt member 16 is rotated accordingly, so that the pair of doors 6 connected to the belt member 16 via connecting members 15a and 15b are driven. Specifically, one of the pair of doors 6 is connected to an upper portion of the belt member 16 via the connecting member 15a, and the other is connected to a lower portion of the belt member 16 via the connecting member 15b, so that when the belt member 16 rotates, the pair of doors 6 are driven in opposite directions to realize the opening/closing operation.

The opening/closing device 1 having this configuration is configured to be able to restrict access between areas partitioned by the opening/closing device 1 by controlling the pair of doors 6 to be in the open or closed state at a predetermined timing. Specifically, when the pair of doors 6 is in the open state, the areas partitioned by the opening/closing device 1 communicate with each other to allow the access, while when the pair of doors 6 is in the closed state, the areas partitioned by the opening/closing device 1 are separated from each other to prohibit the access.

The opening/closing control of the pair of doors 6 is performed by a controller (not shown). Although the details of the opening/closing control are omitted here, for example, when the opening/closing device 1 is a platform door installed on a transportation platform, the opening/closing control is synchronized with the timing of vehicle entry into the platform. The opening/closing device 1 may be an interlocking platform door which is controlled to open or close in conjunction with the opening/closing timing of a vehicular door of a vehicle entering the platform, or a non-interlocking platform door which is controlled to open or close independently of the opening/closing timing of the vehicular door.

Further, the opening/closing device 1 is equipped with a driving current sensor 18 for detecting the driving current Id of the motor 8. The driving current sensor 18 is installed on a power supply circuit 11 electrically connecting the motor 8 and the power supply 5. The detection result (driving current Id) of the driving current sensor 18 can be taken out as an electric signal as described later. The driving current sensor 18 may be, for example, a current transducer (CT).

The opening/closing device 1 shown in FIG. 1 may be a full-screen type which is provided from the floor surface 2 to the ceiling to completely separate the areas partitioned by the opening/closing device 1, or a movable platform fence type which is set at a height corresponding to the human chest, for example, to partially separate the areas partitioned by the opening/closing device 1.

Figure 2:
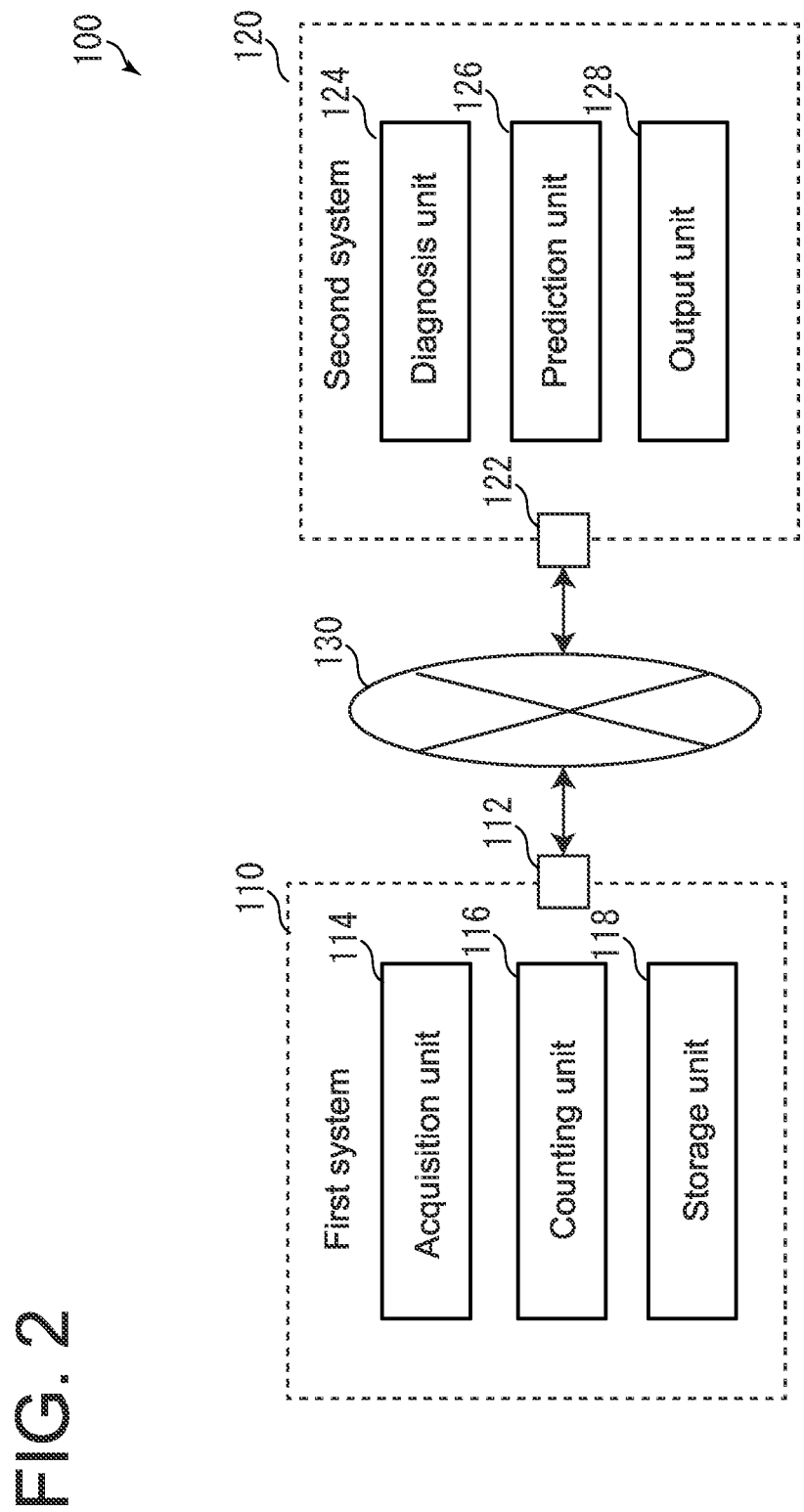
FIG. 2 is an overall configuration diagram of a diagnosis system according to at least one embodiment of the present disclosure.

Next, a diagnosis system 100 for diagnosing the opening/closing device 1 having the above configuration will be described. FIG. 2 is an overall configuration diagram of the diagnosis system 100 according to at least one embodiment of the present disclosure.

The integrity diagnosis system 100 includes a first system 110 installed relatively close to the site (field) where the opening/closing device 1 to be diagnosed is disposed, and a second system 120 installed on a base station or the like geographically separated from the first system 110. The first system 110 and the second system 120 are connected via a network 130 to transmit and receive various data to and from each other. Specifically, the first system 110 and the second system 120 are configured to be able to communicate with each other via the network 130 using a first router 112 and a second router 122 as communication interfaces, respectively. Data transmission/reception by the first router 112 and the second router 122 is performed under predetermined conditions as described later.

The network 130 may be a wired network or a wireless network.

The first system 110 includes a driving current acquisition unit 114 (an example of the acquisition unit 114), an opening/closing counting unit 116 (an example of the counting unit 116), and a storage unit 118. The second system 120 includes an integrity diagnosis unit 124 (an example of the diagnosis unit 124), a maintenance timing prediction unit 126 (an example of the prediction unit 126), and a diagnosis result output unit 128 (an example of the output unit 128).

The driving current acquisition unit 114 acquires the driving current Id of the motor 8 by acquiring a detection signal of the driving current sensor 18 (see FIG. 1). The driving current Id is acquired by the driving current acquisition unit 114 continuously in time. The driving current Id acquired by the driving current acquisition unit 114 is stored in the storage unit 118 as a temporal change of the driving current Id by recording the magnitude of the driving current Id and the measurement time in association with each other. The driving current Id is acquired by the driving current acquisition unit 114 at intervals at which the time resolution is sufficiently small with respect to a current waveform, which will be described later.

The opening/closing counting unit 116 counts the number of opening/closing operations of the pair of doors 6 of the opening/closing device 1. As described above, the pair of doors 6 is controlled to open or close by the controller (not shown) of the opening/closing device 1. The opening/closing counting unit 116 counts the number of opening and closing of the pair of doors 6 and stores an integrated value in the storage unit 118. The number of opening and closing may be counted by the opening/closing counting unit 116 by obtaining a measurement result of an opening/closing counter (not shown) installed on the pair of doors 6, or based on a control signal from the controller (not shown) of the opening/closing device 1. The number of opening and closing stored in the storage unit 118 may be reset at a predetermined timing (for example, every periodic inspection).

The storage unit 118 is a storage device capable of storing various data handled by the first system 110. The various data stored in the storage unit 118 include the temporal change of the driving current Id acquired by the driving current acquisition unit 114 and the number of opening/closing operations of the pair of doors 6 counted by the opening/closing counting unit 116. The various data are stored in the storage unit 118 in a readable manner as appropriate.

The integrity diagnosis unit 124 diagnoses the integrity of the opening/closing device 1, based on data acquired from the first system 110. Although the method of diagnosing the integrity by the integrity diagnosis unit 124 will be described later, the diagnosis result thereof is output from the diagnosis result output unit 128 in a predetermined format.

The maintenance timing prediction unit 126 predicts a maintenance timing of the opening/closing device 1 in consideration of the diagnosis result of the integrity diagnosis unit 124. The maintenance timing predicted by the maintenance timing prediction unit 126 is output by the diagnosis result output unit 128 together with the diagnosis result of the integrity diagnosis unit 124 described above.

The diagnosis result output unit 128 outputs the diagnosis result regarding the integrity of the opening/closing device 1. This diagnosis result includes information on the integrity diagnosed by the integrity diagnosis unit 124 and the maintenance timing predicted by the maintenance timing prediction unit 126, and is output in a predetermined format. The diagnosis result output from the diagnosis result output unit 128 may be output on the second system 120 side, or may be transmitted via the network 130 and output on the first system 110 side.

Figure 3:
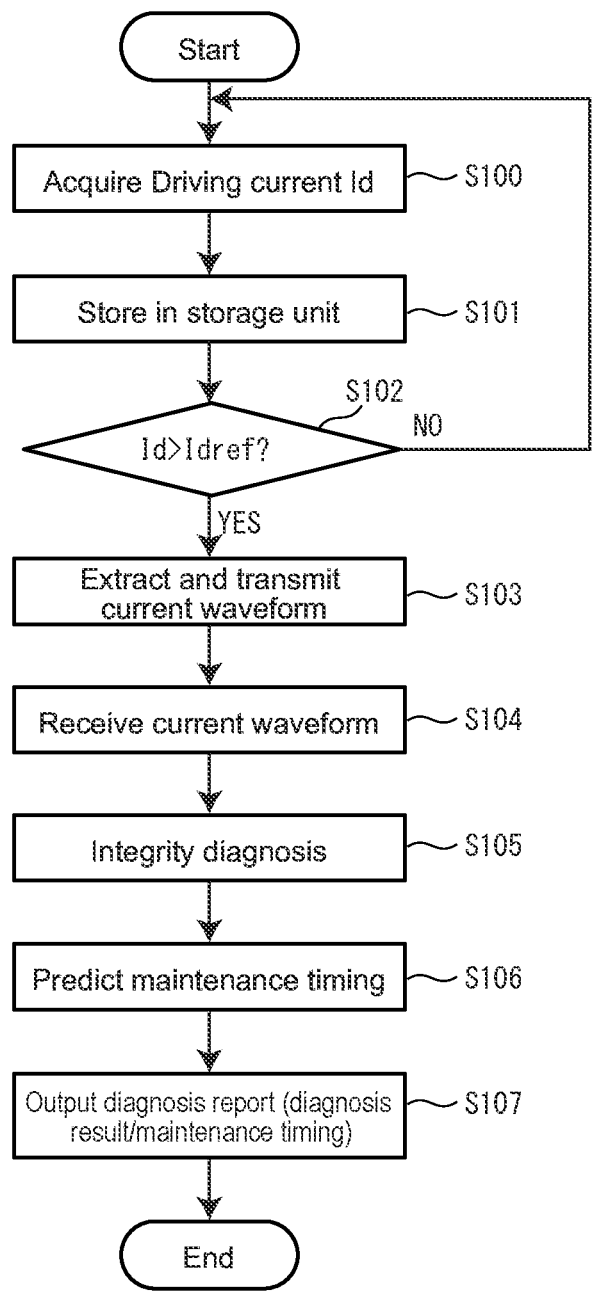
FIG. 3 is a flowchart schematically showing steps of a diagnosis method performed by the diagnosis system of FIG. 2.

Next, the diagnosis method performed by the diagnosis system 100 having the above configuration will be described. FIG. 3 is a flowchart schematically showing steps of the diagnosis method performed by the diagnosis system 100 of FIG. 2.

The driving current acquisition unit 114 acquires the driving current Id of the motor 8 (step S100). The driving current Id is acquired in step S100 by acquiring an output signal of the driving current sensor 18. Since the driving current Id is continuously detected by the driving current sensor 18 regardless of the operational state of the opening/closing device 1, the driving current Id can be acquired by the driving current acquisition unit 114 without affecting the operational state of the opening/closing device 1.

The driving current Id is acquired by the driving current acquisition unit 114 continuously in time, and the acquired result is stored in the storage unit 118 at any time as a temporal change of the driving current Id defined by associating the magnitude of the driving current Id with the acquisition time (step S101). The acquisition of the driving current Id by the driving current acquisition unit 114 is performed with a sufficiently small time resolution so that a current waveform used for diagnosis can be defined from the temporal change of the driving current Id.

Figure 4:
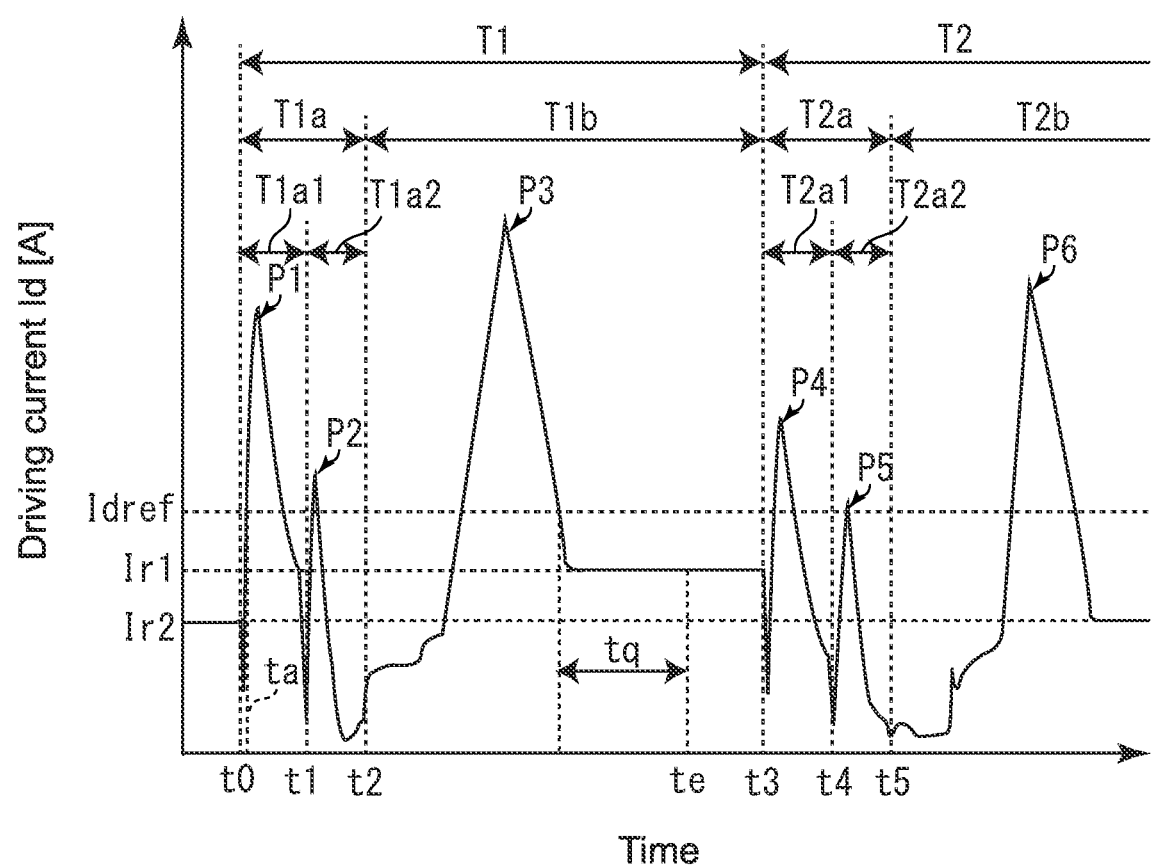
FIG. 4 shows an example of a temporal change of a driving current acquired by an acquisition unit.

Here, FIG. 4 shows an example of the temporal change of the driving current Id acquired by the driving current acquisition unit 114. FIG. 4 shows the temporal change of the driving current Id for one cycle including one open control period T1 during which the opening/closing device 1 is controlled to open and one closed control period T2 during which the opening/closing device 1 is controlled to close. At the end of the closed control period T2, the opening/closing device 1 returns to the same state as at the start of the open control period T1, so that the open control period T1 and the closed control period T2 are repeated every cycle.

In the open control period T1, the pair of doors 6 is in the fully closed state at the time t0, which is the initial state. The open control period T1 includes an opening period T1$a$ in which the pair of doors 6 is opened from the time t0 to the time t2, and an open lock period T1$b$ in which the open lock control for maintaining the pair of doors 6 in the fully open state is performed from the time t2 to the time t3. The opening period T1$a$ includes a first opening period T1$a$1 in which a torque required to fully open the fully closed pair of doors 6 is output from the motor 8 from the time t0 to the time t1, and a second opening period T1$a$2 in which the pair of doors 6 is aligned with the fully open position, which is the target position, by moving the pair of doors 6 at a slower speed than in the first opening period T1$a$1. In the first opening period T1$a$1 and the second opening period T1$a$2, peaks P1 and P2 (<P1) of the driving current Id appear so as to correspond to the opening of the pair of doors 6.

Further, in the open lock period T1$b$, a torque required to maintain the pair of doors 6 in the fully open state is output from the motor 8, and a peak P3 that is broader and larger than the two peaks P1 and P2 in the opening period T1$a$ appears, followed by a constant open lock maintenance current value Ir1.

In the closed control period T2, the pair of doors 6 is in the fully open state at the time t3, which is the initial state. The closed control period T2 includes a closing period T2$a$ in which the pair of doors 6 is closed from the time t3 to the time t5, and a closed lock period T2$b$ in which the closed lock control for maintaining the pair of doors 6 in the fully closed state is performed from the time t5. The closing period T2$a$ includes a first closing period T2$a$1 in which a torque required to fully close the fully open pair of doors 6 is output from the motor 8 from the time t3 to the time t4, and a second closing period T2$a$2 in which the pair of doors 6 is aligned with the fully closed position, which is the target position, by moving the pair of doors 6 at a slower speed than in the first closing period T2$a$1. In the first closing period T2$a$1 and the second closing period T2$a$2, peaks P4 and P5 (<P4) of the driving current Id appear so as to correspond to the closing of the pair of doors 6.

Further, in the closed lock period T2$b$, a torque required to maintain the pair of doors 6 in the fully closed state is output from the motor 8, and a peak P6 that is broader and larger than the two peaks P4 and P5 in the closing period T2$a$ appears, followed by a constant closed lock maintenance current value Ir2 (<Ir1).

Returning to FIG. 3, then, the first system 110 determines whether the driving current Id detected by the driving current acquisition unit 114 exceeds a reference value Idref (step S102). The reference value Idref is a threshold for determining whether to transmit the data stored in the storage unit 118 in step S101 to the second system 120 via the network 130. In the present embodiment, the reference value Idref is set to be larger than the open lock maintenance current value Ir1 and the closed lock maintenance current value Ir2, so that a current waveform CW defined from the temporal change of the driving current Id stored in the storage unit 118 in step S101 is transmitted to the second system 120 via the network 130, triggered by the opening or closing operation of the opening/closing device 1.

If the driving current Id acquired by the driving current acquisition unit 114 is equal to or less than the reference value Idref (step S102: NO), the process returns to step S100, and the acquisition of the driving current Id and the storage in the storage unit 118 are performed again. In this case, the stored contents of the storage unit 118 may be updated (overwritten) according to the storage capacity of the storage unit 118.

Conversely, if the driving current Id acquired by the driving current acquisition unit 114 exceeds the reference value Idref (step S102: YES), the first system 110 extracts the current waveform CW from the temporal change of the driving current Id stored in the storage unit 118, and transmits it to the second system 120 via the network 130 (step S103).

The current waveform CW extracted from the temporal change of the driving current Id in step S103 is defined in the temporal change of the driving current Id stored in the storage unit 118 from a waveform start point ts set before a point where the driving current Id exceeds the reference value Idref to a waveform end point te until which the driving current Id is kept less than the reference value Idref for a predetermined period. In the example of FIG. 4, the waveform start point ts is set before a predetermined period tp (for example, several seconds) from the point to exceeding the reference value, and the waveform end point te is set as a point until which the driving current Id is kept less than the reference value Idref for a predetermined period tq (for example, several seconds). As a result, the current waveform CW at the time of opening and closing used for diagnosis can be appropriately extracted from a series of temporal change of the driving current Id stored in the storage unit 118.

Subsequently, the second system 120 receives the current waveform CW transmitted in step S103 (step S014), and the integrity diagnosis unit 124 diagnoses the integrity of the opening/closing device 1 based on the current waveform CW received in step S104 (step S105). Thus, in the continuous temporal change of the driving current Id, only the current waveform CW at the time of opening and closing used for diagnosis is sent to the second system 120 via the network 130, and the diagnosis is performed. As a result, it is possible to perform the integrity diagnosis with high reliability in the second system 120 at a remote location from the opening/closing device 1 while suppressing the communication load and the power consumption.

Figure 5A:
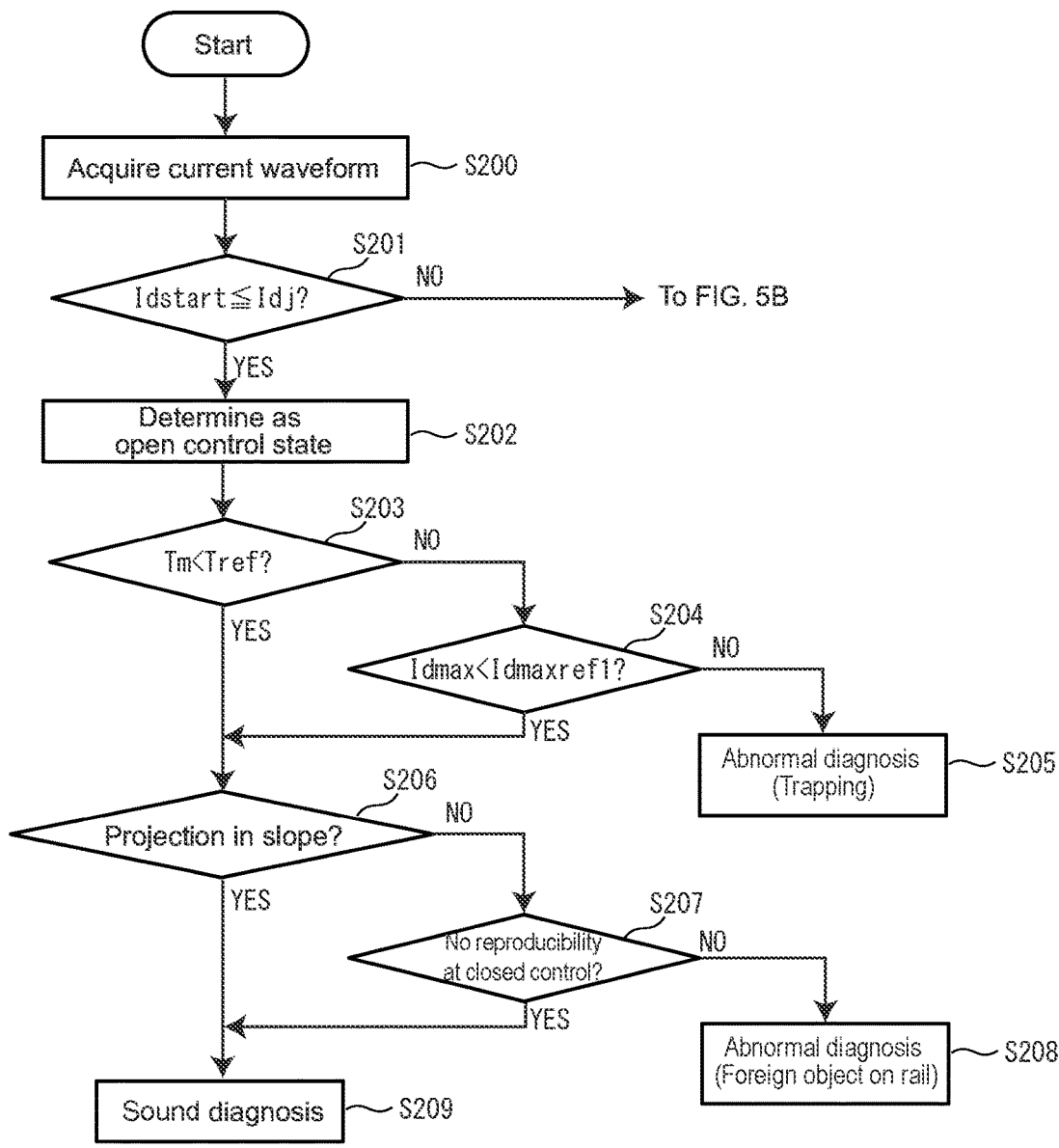
FIG. 5A is a flowchart showing steps of a diagnosis method performed by a diagnosis unit.
Figure 5B:
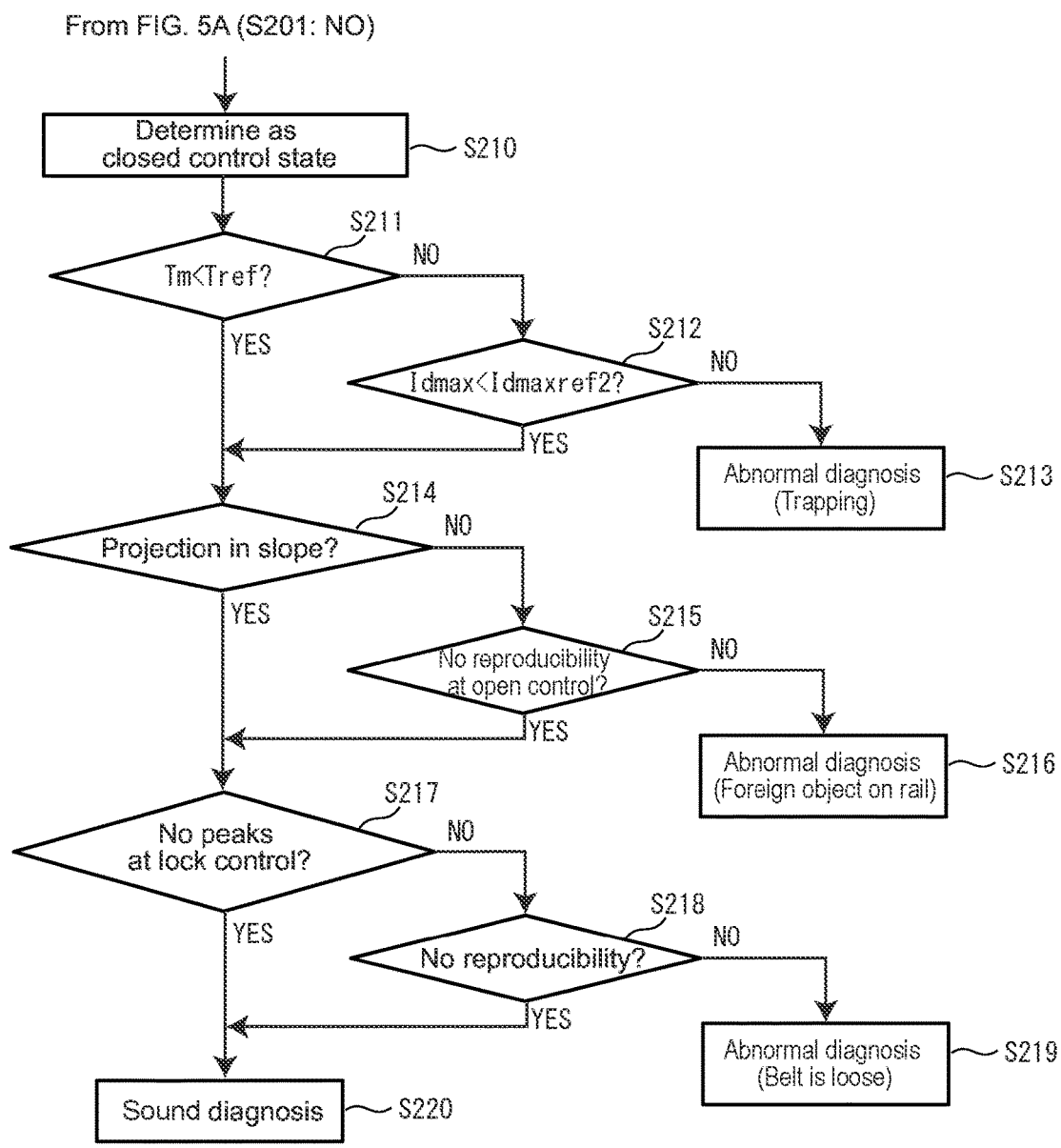
FIG. 5B is a flowchart showing steps of a diagnosis method performed by a diagnosis unit.

Next, the diagnosis method in step S105 will be described specifically. FIGS. 5A and 5B are each a flowchart showing steps of the integrity diagnosis method performed by the integrity diagnosis unit 124.

First, as shown in FIG. 5A, the integrity diagnosis unit 124 acquires the current waveform CW received by the second system 120 (step S200). Then, by analyzing the acquired current waveform CW, it is determined whether the driving current Idstart at the waveform start point ts of the current waveform CW is equal to or less than an open/closed determination threshold Idj (step S201). The open/closed determination threshold Idj used as a determination criterion in step S201 is a current threshold for determining whether the current waveform CW corresponds to the open control period T1 or the closed control period T2. As described above with reference to FIG. 4, in the current waveform CW corresponding to the open control period T1, the driving current Idstart (=closed lock maintenance current value Ir2) at the waveform start time ts is smaller than the driving current Idstart (=open lock maintenance current value Ir1) at the waveform start time ts included in the current waveform CW corresponding to the closed control period T2. Therefore, by setting the open/closed determination threshold Idj between the open lock maintenance current value Ir1 and the closed lock maintenance current value Ir2 (that is, Ir2<Idj<Ir1), it can be determined whether the current waveform CW corresponds to the open control period T1 or the closed control period T2.

Thus, the integrity diagnosis unit 124 determines whether the current waveform CW corresponds to the open control state or the closed control state, and as will be described later, diagnoses the integrity of the opening/closing device based on a diagnosis criterion set corresponding to the determination result. That is, the reliability can be improved more effectively by performing the integrity diagnosis based on the diagnosis criterion set according to the operating state of the opening/closing device.

If the driving current Idstart is equal to or less than the open/closed determination threshold Idj (step S201: YES), it is determined that the current waveform CW acquired in step S200 corresponds to the open control period T1 (step S202). In this case, the integrity diagnosis unit 124 further determines whether the measurement time Tm of the current waveform CW (duration of the current waveform CW) is less than a predetermined threshold Tref (step S203). The threshold Tref used in step S203 is a predetermined time set to have a margin with respect to the normal operation, for example.

If the measurement time Tm of the current waveform CW is equal to or greater than the threshold Tref (step S203: NO), the integrity diagnosis unit 124 determines whether the maximum current value Idmax contained in the current waveform CW is less than a threshold Idmaxref1 (step S204). If the maximum current value Idmax is equal to or greater than the threshold Idmaxref1 (step S204: NO), the integrity diagnosis unit 124 diagnoses that there is an abnormality that a foreign object is caught during the open control of the opening/closing device 1 (step S205).

Figure 6:
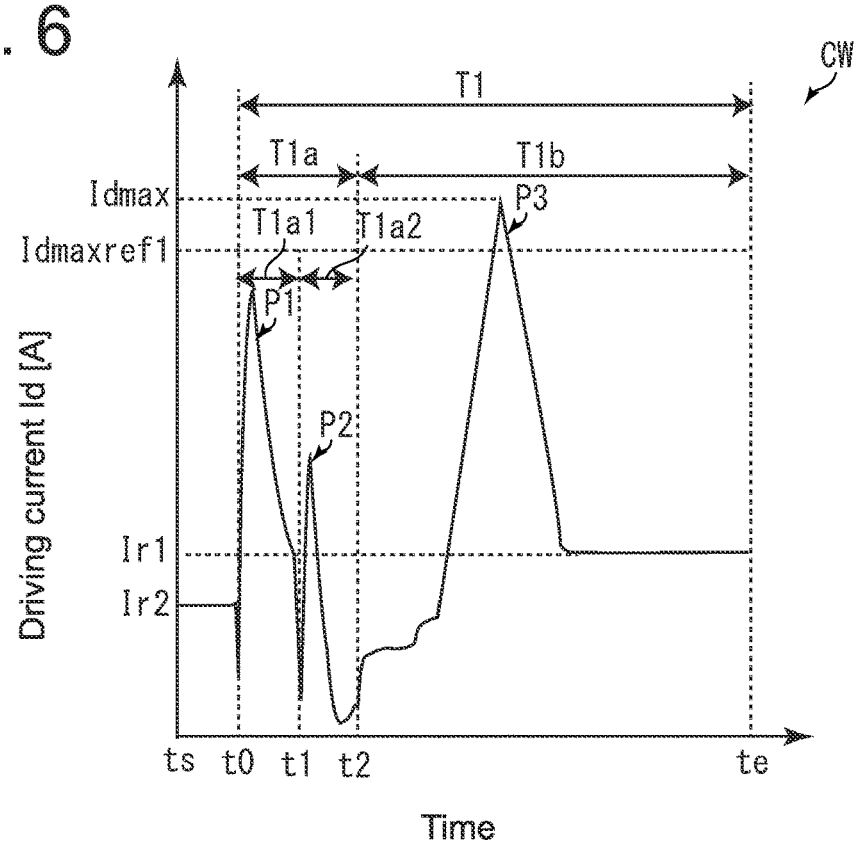
FIG. 6 shows an example of a current waveform acquired by a diagnosis unit.

FIG. 6 shows an example of the current waveform CW acquired by the integrity diagnosis unit 124. In the example of FIG. 6, the current waveform CW has the maximum current value Idmax at the peak P3, which is included in the open lock period T1b, and the maximum current value Idmax is greater than the threshold Idmaxref1. This indicates that, due to the foreign object caught in the pair of doors 6, an excessive load is applied to the motor 8 which supplies power to the pair of doors 6, and the maximum current value Idmax is increased.

Conversely, if the measurement time Tm of the current waveform CW is less than the threshold Tref (step S203: YES), or if the maximum current value Idmax contained in the current waveform CW is less than the threshold Idmaxref1 (step S204: YES), the integrity diagnosis unit 124 determines whether a projection exists in a slope contained in the current waveform CW (step S206). If a projection exists in the slope (step S206: NO), on condition that the reproducibility is similarly obtained at the closed control (step S207: NO), the integrity diagnosis unit 124 diagnoses that there is an abnormality that a foreign object is on the rail 4 (step S208).

Figure 7:
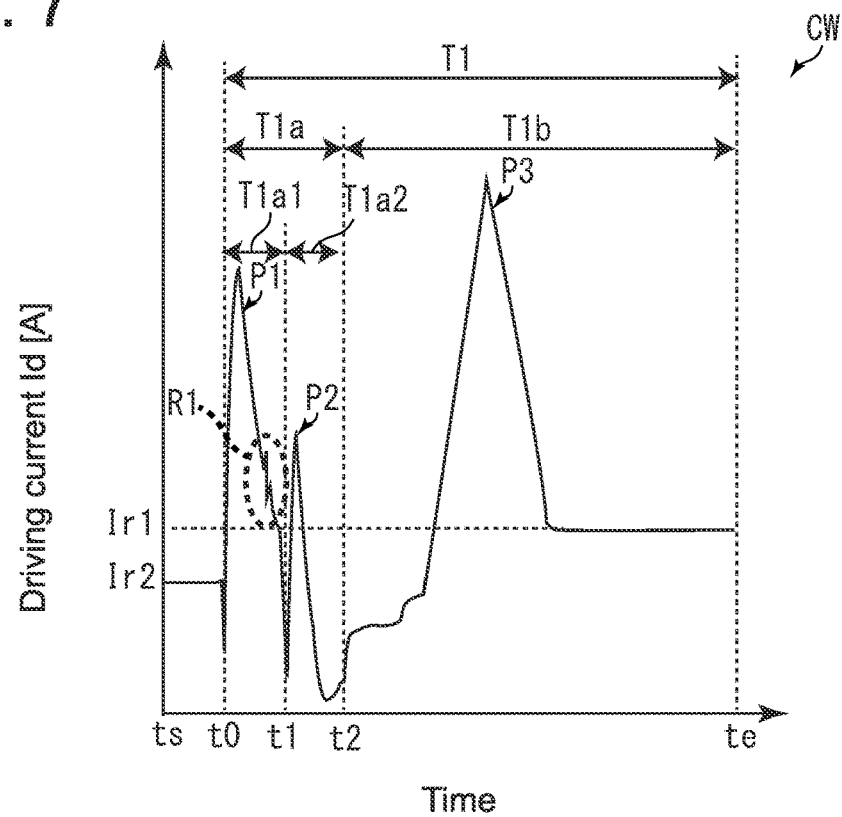
FIG. 7 shows another example of a current waveform acquired by a diagnosis unit.

FIG. 7 shows another example of the current waveform CW acquired by the integrity diagnosis unit 124. In the example of FIG. 7, a projection is formed on a slope in a region R1 of the current waveform CW surrounded by the dotted line. This is because, when the door 6 moves on the rail 4, the foreign object on the rail 4 temporarily obstructs the movement of the door 6, which appears as a disturbance of the current waveform CW.

Conversely, if no projection exists in the slope (step S206: YES), or if the reproducibility is not obtained at the closed control (step S207: YES), the integrity diagnosis unit 124 diagnoses that the opening/closing device 1 is sound (step S209).

Further, if the driving current Idstart is larger than the open/closed determination threshold Idj (step S201: NO), as shown in FIG. 5B, the integrity diagnosis unit 124 determines that the current waveform CW acquired in step S200 corresponds to the open control period T1 (step S210). In this case, the integrity diagnosis unit 124 further determines whether the measurement time Tm of the current waveform CW (duration of the current waveform CW) is less than a predetermined threshold Tref (step S211). The determination in step S211 is the same as that in step S203.

If the measurement time Tm of the current waveform CW is equal to or greater than the threshold Tref (step S211: NO), the integrity diagnosis unit 124 determines whether the maximum current value Idmax contained in the current waveform CW is less than a threshold Idmaxref2 (step S212). If the maximum current value Idmax is equal to or greater than the threshold Idmaxref2 (step S212: NO), the integrity diagnosis unit 124 diagnoses that there is an abnormality that a foreign object is caught during the closed control of the opening/closing device 1 (step S213). The determination in step S212 is the same as that in step S204.

Conversely, if the measurement time Tm of the current waveform CW is less than the threshold Tref (step S211: YES), or if the maximum current value Idmax contained in the current waveform CW is less than the threshold Idmaxref2 (step S212: YES), the integrity diagnosis unit 124 determines whether a projection exists in a slope contained in the current waveform CW (step S214). If a projection exists in the slope (step S214: NO), on condition that the reproducibility is similarly obtained at the open control (step S215: NO), the integrity diagnosis unit 124 diagnoses that there is an abnormality that a foreign object is on the rail 4 (step S216). The determinations in steps S214 and S215 are the same as those in steps S206 and S207.

Conversely, if no projection exists in the slope (step S214: YES), or if the reproducibility is not obtained at the open control (step S215: YES), the integrity diagnosis unit 124 further determines whether multiple peaks appear in the current waveform CW during the period (see the closed lock period T2b in FIG. 4) in which the lock control is performed (step S217). If multiple peaks appear during the closed lock period T2b (step S217: NO), on condition that the reproducibility is obtained (step S218: NO), the integrity diagnosis unit 124 diagnoses that the belt member 16 is loose (step S219).

Figure 8:
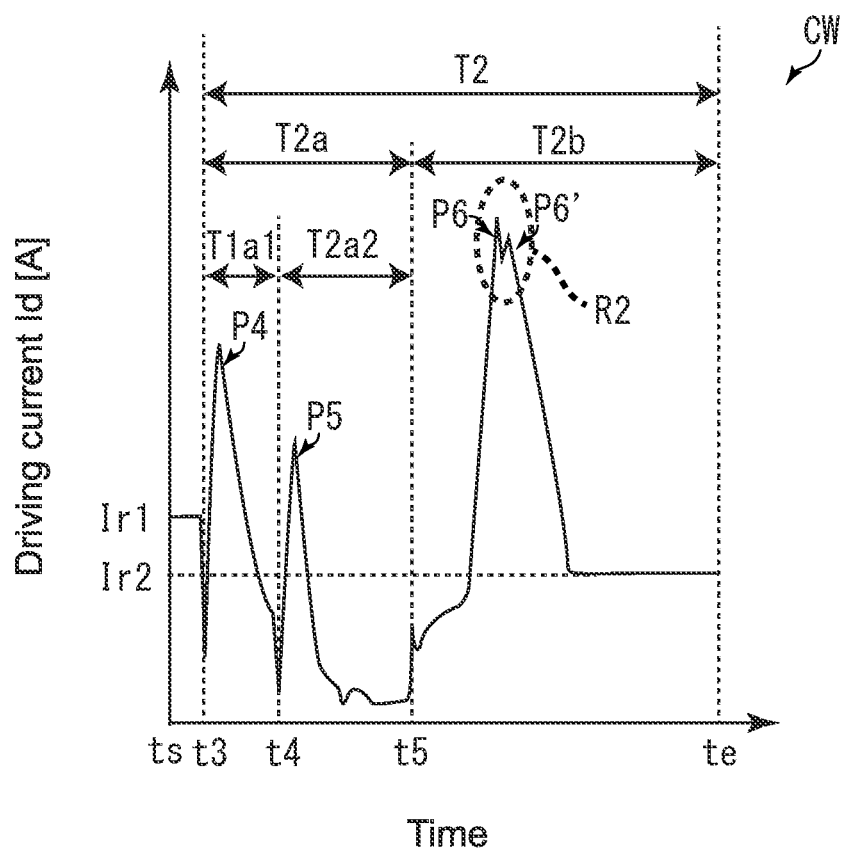
FIG. 8 shows another example of a current waveform acquired by a diagnosis unit.

FIG. 8 shows another example of the current waveform acquired by the integrity diagnosis unit 124. In the example of FIG. 8, in addition to the peak P6 contained in the sound current waveform shown in FIG. 4, another peak P6' appears in a region R2 of the current waveform CW surrounded by the dotted line, i.e., multiple peaks appear. This is because not a little idling is caused when the belt member 16 for transmitting the power of the motor 8 to the door 6 is loose, which disturbs the current waveform CW and appears as multiple peaks.

In the case where the opening/closing device 1 is provided with an encoder (not shown) capable of counting the rotation speed of the motor 8, whether the belt member 16 is loose may be diagnosed based on the positions of the pair of doors 6 estimated from the counting result of the encoder, and the final abnormality diagnosis may be performed by collating this diagnosis result with the diagnosis result according to the above-described method. In this case, since the abnormality diagnosis can be performed from two viewpoints, more reliable diagnosis can be performed.

Conversely, if multiple peaks do not appear during the period of the current waveform CW in which the lock control is performed (step S217: YES), or if the reproducibility is not obtained (step S218: YES), the integrity diagnosis unit 124 diagnoses that the opening/closing device 1 is sound (step S220).

As another example of the diagnosis method by the integrity diagnosis unit 124, the integrity may be diagnosed by comparing the current waveform CW with a past current waveform when an abnormality has occurred. Alternatively, a sound current waveform may be acquired in advance, and when the degree of deviation of the current waveform CW to be diagnosed from the sound current waveform exceeds a predetermined criterion, it may be diagnosed as abnormal.

Returning to FIG. 3, the maintenance timing prediction unit 126 predicts the maintenance timing of the opening/closing device 1 based on the diagnosis result of the integrity diagnosis unit 124 (step S106). For example, the maintenance timing prediction unit 126 predicts the maintenance timing in consideration of at least one factor of the number and frequency of abnormal diagnoses by the integrity diagnosis unit 124, the number of opening and closing of the opening/closing device 1 counted by the opening/closing counting unit 116, and the elapsed period from the previous maintenance execution. As a result, the maintenance timing required to maintain the reliability of the opening/closing device 1 can be accurately predicted, and the influence of maintenance on the operation of the opening/closing device 1 can be effectively suppressed.

Then, the output unit 128 outputs the diagnosis result of the opening/closing device 1 (step S107). This diagnosis result includes information on normal and abnormal diagnosis by the integrity diagnosis unit 124 and the maintenance timing predicted by the maintenance timing prediction unit 126, and is output in a predetermined format.

By including, for example, the risk of failure of the opening/closing device 1 obtained from the frequency of abnormal diagnosis in the opening/closing device 1 in the diagnosis result, it may be possible to provide useful information for future maintenance planning (The failure occurrence risk may be evaluated by obtaining an evaluation parameter by multiplying the frequency of abnormal diagnosis by the integrity diagnosis unit 124 and the number of opening/closing operations of the opening/closing device 1 counted by the opening/closing counting unit 116 in a certain period, for example).

Further, the diagnosis result output from the diagnosis result output unit 128 may be output on the second system 120 side, or may be transmitted via the network 130 and output on the first system 110 side.

As described above, according to the above-described embodiment, the driving current Id of the motor 8, which is the power source of the opening/closing device 1, is detected, and the integrity of the opening/closing device 1 is diagnosed based on the current waveform CW defined from the temporal change of the driving current Id. Since such diagnosis can be performed by detecting the driving current Id of the motor 8 during operation, it is possible to suppress the influence on the normal operation of the opening/closing device 1. Further, by performing the diagnosis based on the current waveform CW defined from the temporal change of the driving current Id, the state of the opening/closing device 1 can be accurately grasped, and the diagnosis can be performed with high reliability.

In addition, the components in the above-described embodiments may be appropriately replaced with known components without departing from the spirit of the present disclosure, or the above-described embodiments may be appropriately combined.

The contents described in the above embodiments would be understood as follows, for instance.

(1) A diagnosis system for an opening/closing device according an aspect is a diagnosis system (e.g., diagnosis system 100 according to the above-described embodiment) for an opening/closing device capable of opening and closing by driving a motor (e.g., motor 8 according to the above-described embodiment), comprising: a driving current acquisition unit (e.g., driving current acquisition unit 114 according to the above-described embodiment) configured to acquire a driving current (e.g., driving current Id according to the above-described embodiment) of the motor; and a diagnosis unit (e.g., integrity diagnosis unit 124 according to the above-described embodiment) configured to diagnose integrity of the opening/closing device, based on a current waveform (e.g., current waveform CW according to the above-described embodiment) defined by a temporal change of the driving current acquired by the driving current acquisition unit.

According to the aspect (1), the integrity of the opening/closing device is diagnosed based on the current waveform defined from the temporal change of the driving current of the motor capable of supplying power to the opening/closing device. Since the temporal change of the driving current used for diagnosis can be acquired during the operation of the motor, it is possible to perform the integrity diagnosis while suppressing the influence on the operating state of the opening/closing device. Further, by performing the diagnosis based on the current waveform defined from the temporal change of the driving current, the operating state of the opening/closing device can be accurately grasped, and the diagnosis can be performed with high reliability.

(2) In another aspect, in the above aspect (1), the diagnosis system further comprises a storage unit (e.g., storage unit 118 according to the above-described embodiment) configured to store the temporal change of the driving current. The diagnosis system is configured to, when the driving current exceeds a reference value (e.g., reference value Idref according to the above-described embodiment), transmit the current waveform included in the temporal change of the driving current stored in the storage unit to the diagnosis unit via a network (e.g., network 130 according to the above-described embodiment).

According to the aspect (2), the temporal change of the driving current of the motor is appropriately stored and accumulated in the storage unit, and the current waveform defined from the temporal change of the driving current is transmitted to the diagnosis unit via the network, triggered by the driving current exceeding the reference value. As a result, the current waveform related to the opening/closing operation can be transmitted to the geographically separated diagnosis unit via the network for analysis while monitoring the driving current for a long period, and the diagnosis can be performed with high reliability while suppressing communication load and power consumption.

(3) In another aspect, in the above aspect (2), in the temporal change of the driving current, the current waveform is defined from a waveform start point (e.g., waveform start point is according to the above-described embodiment) set before a point where the driving current exceeds the reference value to a waveform end point (e.g., waveform end point to according to the above-described embodiment) until which a value of the driving current is kept less than the reference value for a predetermined period (e.g., predetermined period tq according to the above-described embodiment).

According to the aspect (3), the current waveform used for diagnosis is defined by extracting it from the temporal change of the driving current from the waveform start point to the waveform end point. As a result, the current waveform related to the opening/closing operation can be effectively defined from a series of temporal change of the driving current, and the diagnosis can be performed with high reliability.

(4) In another aspect, in the above aspect (3), the diagnosis unit is configured to determine whether the current waveform indicates that an operating state of the opening/closing device is an open control state or a closed control state, based on the driving current at the waveform start point of the current waveform, and diagnose integrity of the opening/closing device based on a diagnosis criterion (e.g., FIGS. 5A and 5B according to the above-described embodiment) set according to the operating state.

According to the aspect (4), whether the current waveform corresponds to the opening state or the closing state is determined based on the magnitude of the driving current at the waveform start point of the current waveform used for diagnosis. Further, the reliability can be improved more effectively by performing the diagnosis based on the diagnosis criterion set according to the operating state or the closing state.

(5) In another aspect, in any one of the above aspects (1) to (4), the opening/closing device includes a door (e.g., door 6 according to the above-described embodiment) capable of moving on a rail (e.g., rail 4 according to the above-described embodiment) by a power output from the motor. The diagnosis unit is configured to diagnose whether there is a foreign object on the rail, based on whether a projection (e.g., region R1 according to the above-described embodiment) exists in a slope contained in the current waveform.

According to the aspect (5), it is possible to suitably diagnose whether a foreign object is on the rail on which the opening and closing door moves, based on whether a projection exists in the slope contained in the current waveform.

(6) In another aspect, in any one of the above aspects (1) to (5), the opening/closing device includes a belt member (e.g., belt member 16 according to the above-described embodiment) for transmitting a power output from the motor to a door (e.g., door 6 according to the above-described embodiment) capable of opening and closing. The diagnosis unit is configured to diagnose that the belt member is loose if the current waveform when lock control for maintaining the door in a fully open state or a fully closed state is performed (e.g., open lock period T1$b$ or closed lock period T2$b$ according to the above-described embodiment) contains a plurality of peaks (e.g., peaks P6, P6' in region R2 according to the above-described embodiment).

According to the aspect (6), it is possible to suitably diagnose whether the belt member for transmitting the power of the motor to the door is loose, based on whether the current waveform during the lock control in a series of operation of the opening/closing device contains a plurality of peaks.

(7) In another aspect, in any one of the above aspects (1) to (6), the diagnosis unit is configured to diagnose that a foreign object is caught in the opening/closing device if a maximum current value contained in the current waveform is less than a threshold (e.g., threshold Idmaxref1 or Idmaxref2 according to the above-described embodiment).

According to the aspect (7), it is possible to suitably diagnose whether a foreign object is caught in the opening/ closing device, based on whether the maximum current value contained in the current waveform is less than the threshold.

(8) In another aspect, in any one of the above aspects (1) to (7), the diagnosis system further comprises a prediction unit (e.g., maintenance timing prediction unit 126 according to the above-described embodiment) configured to predict a maintenance timing of the opening/closing device, based on a diagnosis result of the diagnosis unit.

According to the aspect (8), a future maintenance plan can be efficiently formulated by predicting the maintenance timing of the opening/closing device, based on the diagnosis result regarding the integrity of the opening/closing device. As a result, it is possible to formulate a maintenance plan that suppresses the influence on the operation of the opening/closing device.

(9) In another aspect, in the above aspect (8), the diagnosis system further comprises an opening/closing counting unit (e.g., opening/closing counting unit 116 according to the above-described embodiment) configured to count the number of opening and closing of the opening/closing device. The prediction unit is configured to predict the maintenance timing, based on the number of opening and closing counted by the opening/closing counting unit.

According to the aspect (9), considering the number of opening and closing of the opening/closing device in addition to the integrity diagnosis result based on the current waveform, it is possible to more suitably predict the maintenance timing required for the opening/closing device in the future.

(10) In another aspect, in any one of the above aspects (1) to (9), the diagnosis system further comprises an output unit configured to output a diagnosis result of the diagnosis unit.

According to the aspect (10), by outputting the diagnosis result of the diagnosis unit to the outside by the output unit, it can be effectively used for formulating the maintenance plan of the opening/closing device based on the diagnosis result.

(11) In another aspect, in any one of the above aspects (1) to (10), the opening/closing device is a platform door.

According to the aspect (11), the integrity of the platform door, which is a platform door installed on a transportation platform, can be diagnosed. Thus, the integrity of the platform door can be diagnosed with high reliability while suppressing the influence on the operation of the transportation system, so that the malfunction of the platform door that affects the operating rate of the transportation system can be effectively prevented.

(12) A diagnosis method for an opening/closing device according an aspect is a diagnosis method for an opening/closing device (e.g., opening/closing device 1 according to the above-described embodiment) capable of opening and closing by driving a motor (e.g., motor 8 according to the above-described embodiment), comprising: a step of acquiring a driving current (e.g., driving current Id according to the above-described embodiment) of the motor; and a step of diagnosing integrity of the opening/closing device, based on a current waveform (e.g., current waveform CW according to the above-described embodiment) defined by a temporal change of the driving current.

According to the method (12), the integrity of the opening/closing device is diagnosed based on the current waveform defined from the temporal change of the driving current of the motor capable of supplying power to the opening/closing device. Since the temporal change of the driving current used for diagnosis can be acquired during the operation of the motor, it is possible to perform the integrity diagnosis while suppressing the influence on the operating state of the opening/closing device. Further, by performing the diagnosis based on the current waveform defined from the temporal change of the driving current, the operating state of the opening/closing device can be accurately grasped, and the diagnosis can be performed with high reliability.

REFERENCE SIGNS LIST

1 Opening/closing device
2 Floor surface
4 Rail
5 Power supply
6 Door
8 Motor
8a Output shaft
10 Power transmission mechanism
11 Power supply circuit
12 Driving pulley
14 Driven pulley
15a, 15b Connecting member
16 Belt member
18 Driving current sensor
100 Diagnosis system
110 First system
112 First router
114 Driving current acquisition unit
116 Opening/closing counting unit
118 Storage unit
120 Second system
122 Second router
124 Integrity diagnosis unit
126 Maintenance timing prediction unit
128 Diagnosis result output unit
130 Network

The invention claimed is:

1. A diagnosis system for an opening/closing device capable of opening and closing by driving a motor, the diagnosis system comprising:
   a driving current acquisition unit configured to acquire a driving current of the motor; and
   a diagnosis unit configured to diagnose integrity of the opening/closing device, based on a disturbance in a region next to a peak formed corresponding to an opening/closing control of the opening/closing device in a current waveform defined by a temporal change of the driving current acquired by the driving current acquisition unit during an open control period or a close control period, wherein
   the disturbance is a subpeak which is smaller than the peak.

2. The diagnosis system for the opening/closing device according to claim 1, further comprising a storage unit configured to store the temporal change of the driving current,
   wherein the diagnosis system is configured to, when the driving current exceeds a reference value, transmit the current waveform included in the temporal change of the driving current stored in the storage unit to the diagnosis unit via a network.

3. The diagnosis system for the opening/closing device according to claim 2,
   wherein, in the temporal change of the driving current, the current waveform is defined from a waveform start point set before a point where the driving current exceeds the reference value to a waveform end point until which a value of the driving current is kept less than the reference value for a predetermined period.

4. The diagnosis system for the opening/closing device according to claim 3,
wherein the diagnosis unit is configured to determine whether the current waveform indicates that an operating state of the opening/closing device is an open control state or a closed control state, based on the driving current at the waveform start point of the current waveform, and diagnose integrity of the opening/closing device based on a diagnosis criterion set according to the operating state.

5. The diagnosis system for the opening/closing device according to claim 1,
wherein the opening/closing device includes a door capable of moving on a rail by a power output from the motor, and
wherein the diagnosis unit is configured to diagnose whether there is a foreign object on the rail, based on whether a projection exists in a slope contained in the current waveform.

6. The diagnosis system for the opening/closing device according to claim 1,
wherein the opening/closing device includes a belt member for transmitting a power output from the motor to a door capable of opening and closing, and
wherein the diagnosis unit is configured to diagnose that the belt member is loose if the current waveform when lock control for maintaining the door in a fully open state or a fully closed state is performed contains a plurality of peaks including the peak.

7. The diagnosis system for the opening/closing device according to claim 1,
wherein the diagnosis unit is configured to diagnose that a foreign object is caught in the opening/closing device if a maximum current value contained in the current waveform is less than a threshold.

8. The diagnosis system for the opening/closing device according to claim 1, further comprising a prediction unit configured to predict a maintenance timing of the opening/closing device, based on a diagnosis result of the diagnosis unit.

9. The diagnosis system for the opening/closing device according to claim 8, further comprising an opening/closing counting unit configured to count the number of opening and closing of the opening/closing device,
wherein the prediction unit is configured to predict the maintenance timing, based on the number of opening and closing counted by the opening/closing counting unit.

10. The diagnosis system for the opening/closing device according to claim 1, further comprising an output unit configured to output a diagnosis result of the diagnosis unit.

11. The diagnosis system for the opening/closing device according to claim 1, wherein the opening/closing device is a platform door.

12. A diagnosis method for an opening/closing device capable of opening and closing by driving a motor, the diagnosis method comprising:
a step of acquiring a driving current of the motor; and
a step of diagnosing integrity of the opening/closing device, based on a disturbance in a region next to a peak formed corresponding to an opening/closing control of the opening/closing device in a current waveform defined by a temporal change of the driving current during an open control period or a close control period, wherein
the disturbance is a subpeak which is smaller than the peak.

* * * * *